US010489312B2

(12) United States Patent
Narui et al.

(10) Patent No.: US 10,489,312 B2
(45) Date of Patent: *Nov. 26, 2019

(54) STACK ACCESS CONTROL FOR MEMORY DEVICE

(71) Applicant: Micron Technology, Inc., Boise, ID (US)

(72) Inventors: Seiji Narui, Sagamihara (JP); Homare Sato, Sagamihara (JP); Chikara Kondo, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/107,963

(22) Filed: Aug. 21, 2018

(65) Prior Publication Data

US 2018/0357156 A1    Dec. 13, 2018

Related U.S. Application Data

(63) Continuation of application No. 15/606,956, filed on May 26, 2017, now Pat. No. 10,185,652.

(51) Int. Cl.
*G11C 7/06* (2006.01)
*G06F 13/16* (2006.01)
(Continued)

(52) U.S. Cl.
CPC .............. *G06F 13/16* (2013.01); *G11C 5/025* (2013.01); *G11C 5/04* (2013.01); *G11C 5/06* (2013.01);
(Continued)

(58) Field of Classification Search
CPC ...... G11C 16/26; G11C 16/0483; G11C 19/28; G11C 16/08; G11C 16/10; G11C 8/10; G11C 11/4076; G11C 16/24; G11C 16/3459; G11C 29/52; G11C 7/222; G11C 11/4091; G11C 7/08
(Continued)

(56) References Cited

U.S. PATENT DOCUMENTS 9,472,253 B2    10/2016   Narui et al.
10,185,652 B2 *  1/2019   Narui ..................... G06F 13/16
(Continued)

OTHER PUBLICATIONS

U.S. Appl. No. 15/606,956, entitled: "Stack Access Control for Memory Device", filed May 26, 2017.

*Primary Examiner* — Thong Q Le
(74) *Attorney, Agent, or Firm* — Dorsey & Whitney LLP

(57) ABSTRACT

An example apparatus includes a first semiconductor chip and a second semiconductor chip; and a first via and a plurality of second vias coupling the first semiconductor chip and the second semiconductor chip. The first semiconductor chip provides a first timing signal to the first via and further provides first data responsive to the first timing signal to the plurality of second vias. The second semiconductor chip receives the first timing signal from the first via and the first data from the plurality of second vias and further provides the first data responsive to the first timing signal, when the first semiconductor chip is designated, and provides a second timing signal and further provides second data responsive to the second timing signal, when the second semiconductor chip is designated.

20 Claims, 6 Drawing Sheets

(51) Int. Cl.
  *G11C 5/02* (2006.01)
  *G11C 5/04* (2006.01)
  *G11C 5/06* (2006.01)
  *G11C 11/4093* (2006.01)
  *G11C 7/10* (2006.01)

(52) U.S. Cl.
  CPC .. *G11C 11/4093* (2013.01); *G06F 2212/1016* (2013.01); *G06F 2212/1028* (2013.01); *G11C 7/10* (2013.01)

(58) Field of Classification Search
  USPC .... 365/189.03, 191, 194, 233.1, 51, 189.05, 365/233.13, 63
  See application file for complete search history.

(56) References Cited

U.S. PATENT DOCUMENTS

| | | |
|---|---|---|
| 2011/0087811 A1 | 4/2011 | Kondo et al. |
| 2011/0161748 A1 | 6/2011 | Casper et al. |
| 2012/0127812 A1 | 5/2012 | Nishioka et al. |
| 2012/0250387 A1 | 10/2012 | Kondo |
| 2013/0021866 A1 | 1/2013 | Lee |
| 2013/0258788 A1 | 10/2013 | Ide et al. |
| 2015/0213860 A1 | 7/2015 | Narui et al. |
| 2018/0341575 A1 | 11/2018 | Narui et al. |

\* cited by examiner

STACK ACCESS CONTROL FOR MEMORY DEVICE

CROSS-REFERENCE TO RELATED APPLICATION(S)

This application is a continuation of U.S. application Ser. No. 15/606,956 filed May 26, 2017, issued as U.S. Pat. No. 10,185,652 on Jan. 22, 2019, which is incorporated herein by reference, in its entirety, for any purpose.

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking dies vertically and interconnecting the dies using through-silicon (or through-substrate) vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC) and High Bandwidth Memory (HBM).

For example, High Bandwidth Memory (HBM) is a type of memory including a high-performance random access memory (DRAM) interface and vertically stacked DRAMs. FIG. 1A is a schematic diagram of a conventional HBM stack 11 including semiconductor chips, such as an I/F die (e.g. logic die) 12 and a plurality of core dies (DRAM dies) 13. The HBM stack 11 may have two 128-bit channels per core die for a total of eight input/output channels and a width of 1024 bits in total. For example, each core die of the plurality of the core dies 13 is coupled to two channels. In this example, the core dies 13a, 13b, 13c and 13d are coupled to channels A and C, channels B and D, channels E and G, and channels F and H, respectively. For example, a clock frequency, a command sequence, and data can be independently provided for each channel. FIG. 1B is a schematic diagram of a conventional HBM stack 21 including the I/F die 22 and the plurality of core dies 23. The HBM stack 21 may have two 128-bit channels per core die for a total of eight input/output channels and a width of 1024 bits in total. For example, each core die of the plurality of the core dies 23 may include two channels. In this example, a stack group 24a having a stack identifier (SID) "0" includes the core dies 23a, 23b, 23c and 23d including channels A and C, channels B and D, channels E and G, and channels F and H, respectively. A stack group 24b having a stack ID (SID) "1" includes the core dies 23e, 23f, 23g and 23h including channels A and C, channels B and D, channels E and G, and channels F and H, respectively. Thus, a destination die among a plurality of core dies in each channel (e.g., core dies 23a and 23e of channel A) addressed in a command may be identified by the SID.

FIG. 2A is a wiring diagram of the conventional HBM stack 11 including the I/F die 12 and the plurality of core dies 13. The I/F die 12 of the HBM 11 stack provides interfaces 18a, 18b, 18e and 18f which provide signals on four input/output channels among the eight input/output channels, which function independently of each other. Memory arrays of the channel A, channel B, channel E and channel F of the core dies 13a, 13b, 13c and 13d may be coupled to the I/F die 12 via native input/output lines (IOs) 17a, 17b, 17e and 17f, respectively. For example, the native IOs 17a to 17f may be implemented as conductive vias. For example, the conductive vias may have a spiral structure. Each core die 13 may include a command circuit for each channel. For example, the core dies 13a to 13d may include command circuits 16a to 16d for channel A, channel B, channel E and channel F, respectively. Thus, clock signals, command signals and data signals for each channel may be transmitted independently and a plurality of data buses and their respective channels can operate individually.

FIG. 2B is a wiring diagram of the conventional HBM stack 21 including the I/F die 22 and the plurality of core dies 23. The I/F die 22 of the HBM stack 21 provides interfaces 28a, 28b, 28e and 28f which provide signals on four input/output channels among the eight input/output channels of two stack groups. Memory arrays of channels A, B, E and F of the stack group 24a and memory arrays of channels A, B, E and F of the stack group 24b may be coupled to the same native input/output lines (IOs) 27a, 27b, 27e and 27f, respectively. For example, memory arrays of channel A of the core die 23a in the stack group 24a and memory arrays of channel A of the core die 23e in the stack group 24b may be coupled to the native IO 27a. Each core die 23 may include a command circuit for each channel. For example, the core dies 23a to 23d in the stack group 24a may include command circuits 26a to 26d for channel A, channel B, channel E and channel F, respectively. The core dies 23e to 23h in the stack group 24b may include command circuits 26e to 26h for channel A, channel B, channel E and channel F, respectively. Each command circuit 26 may detect the SID in a command, check whether the SID in the command matches with an SID of the stack group of the core die 23 including the command circuit 26, and decode the command. If the SID matches, memory access actions responsive to the command may be performed. For example, when the interface 28a transmits a command on the input/output line 27a, the command circuit 26a receives the command and check whether the SID in the command is "0". The command circuit 26a processes the command if the SID is "0" and ignores the command if the SID is "1". The command circuit 26e also receives the command and check whether the SID in the command is "1". The command circuit 26e processes the command if the SID is "1" and ignores the command if the SID is "0". Thus, clock signals, command signals and data signals for each channel on each die may be transmitted independently.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figures 1A, 1B:
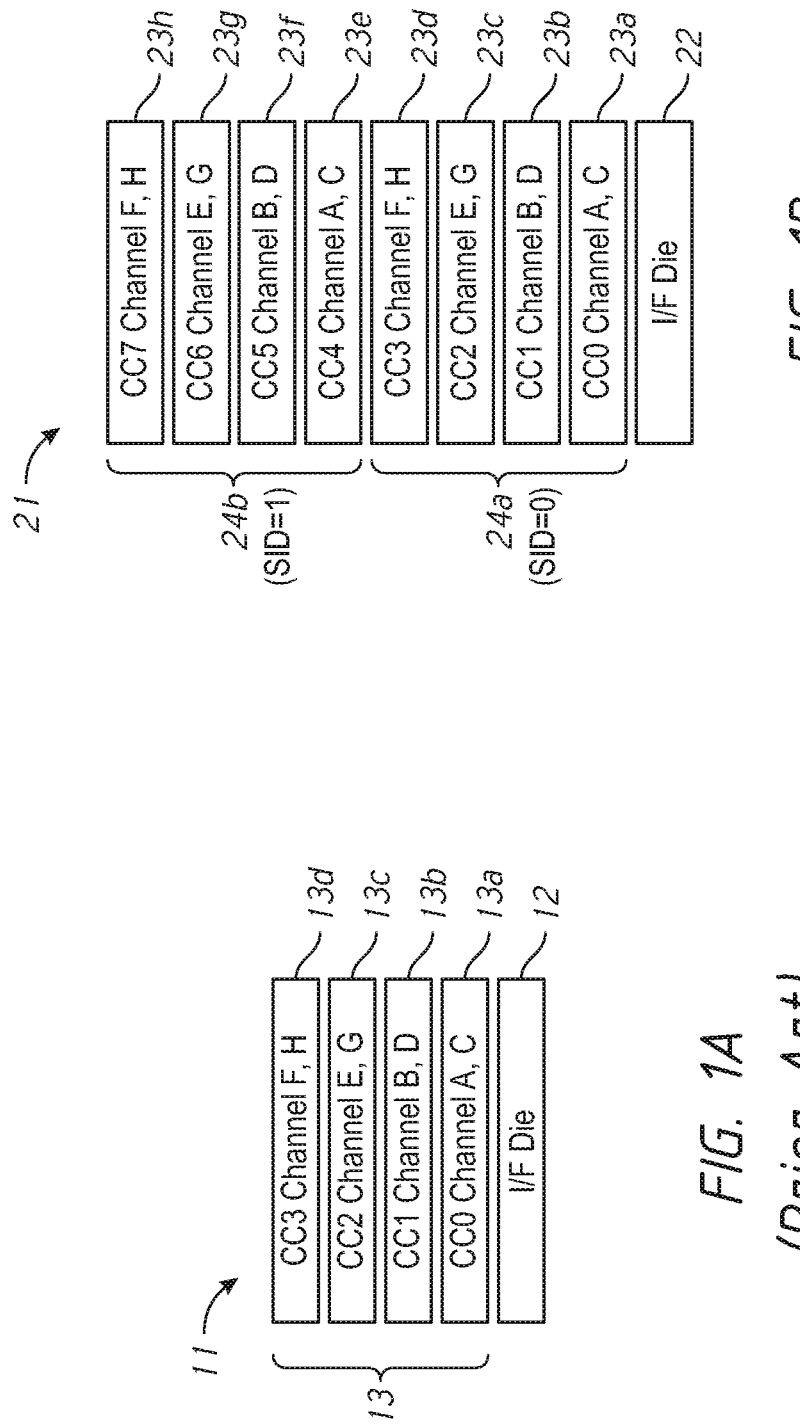
FIG. 1A is a schematic diagram of a conventional HBM stack including the I/F die and the plurality of core dies.
FIG. 1B is a schematic diagram of a conventional HBM stacks including the I/F die and the plurality of core dies.
Figure 2A:
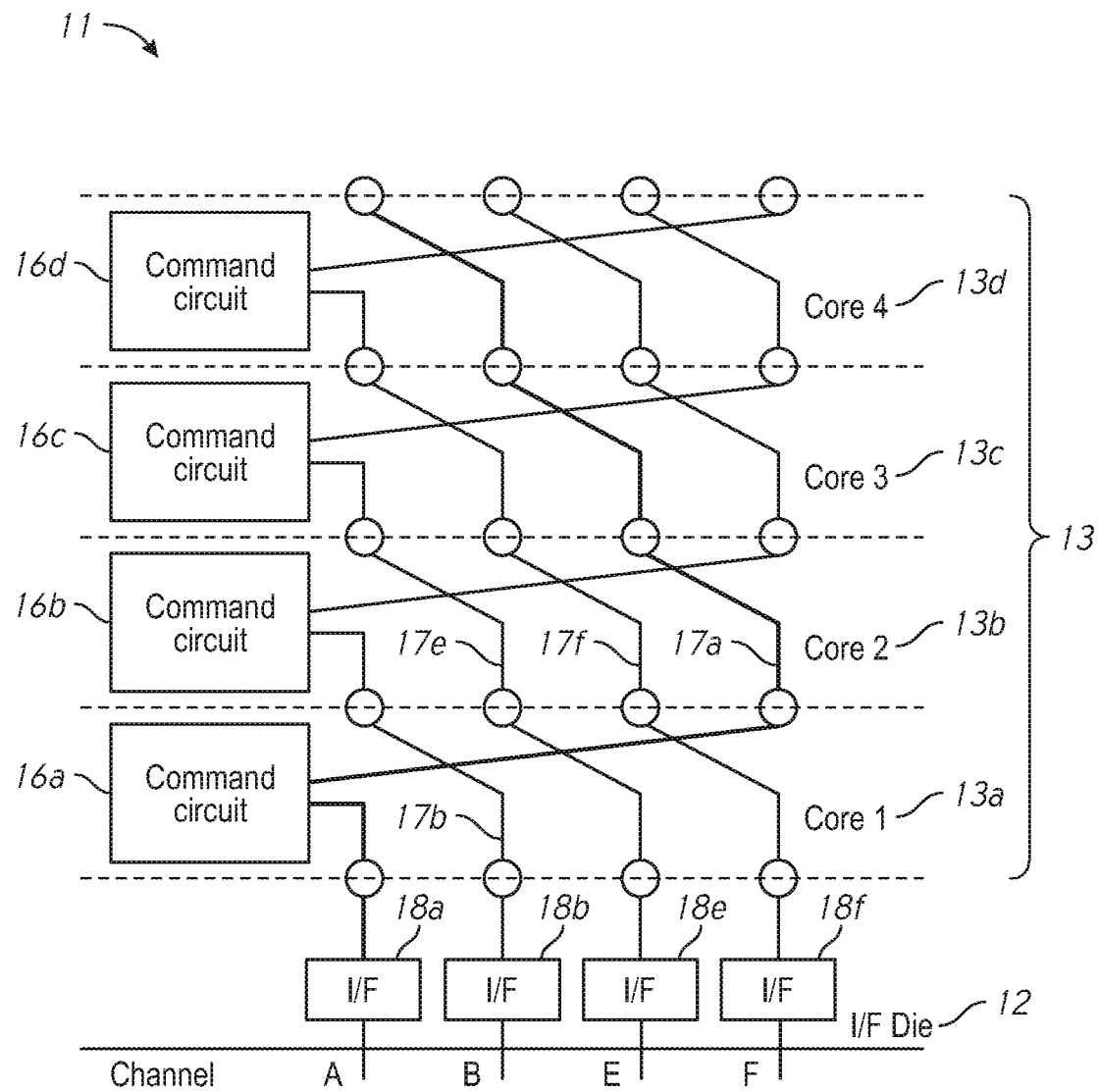
FIG. 2A is a wiring diagram of the conventional HBM stack including the I/F die and the plurality of core dies.
Figure 2B:
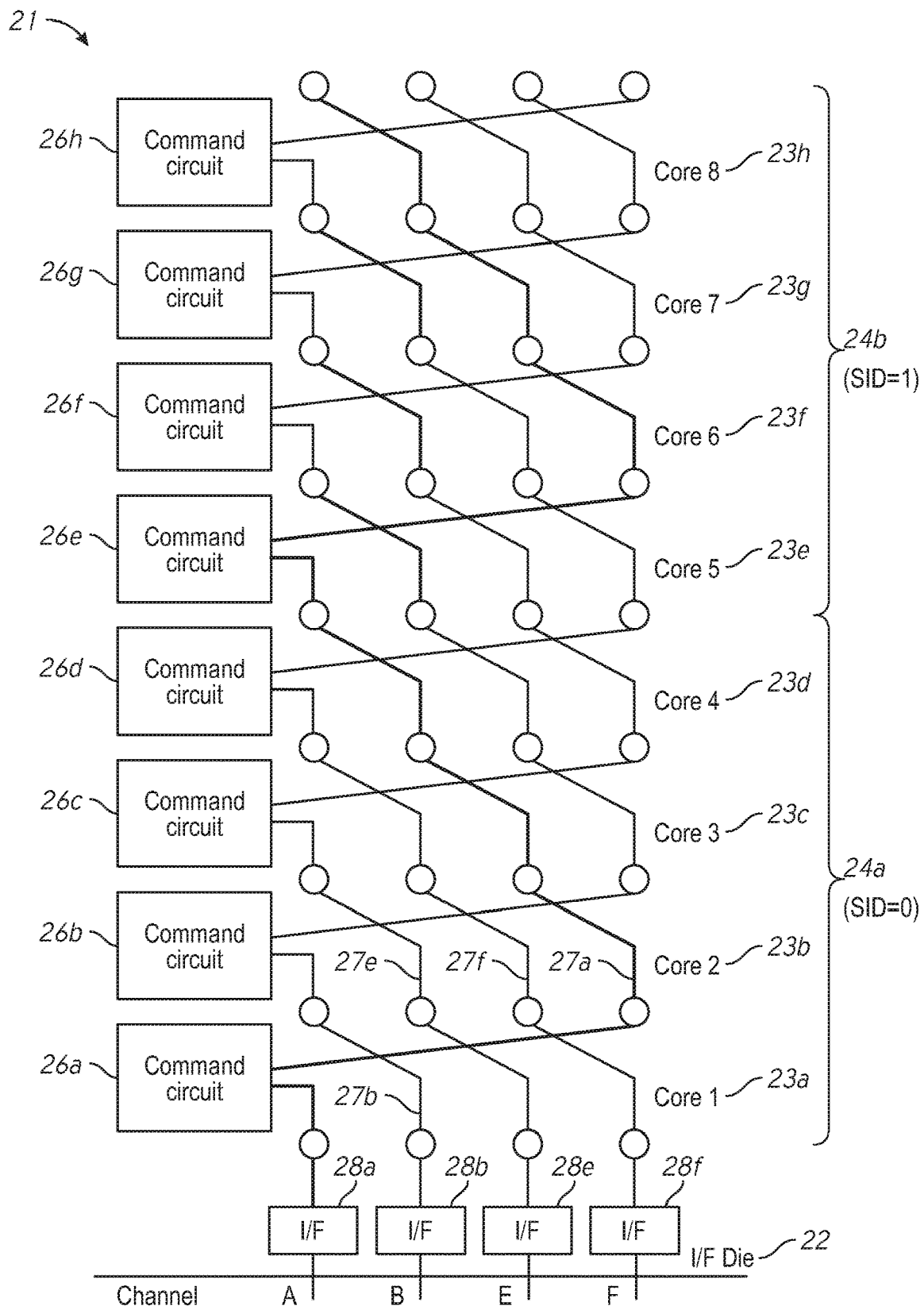
FIG. 2B is a wiring diagram of the conventional HBM stacks including the I/F die and the plurality of core dies.
Figure 3:
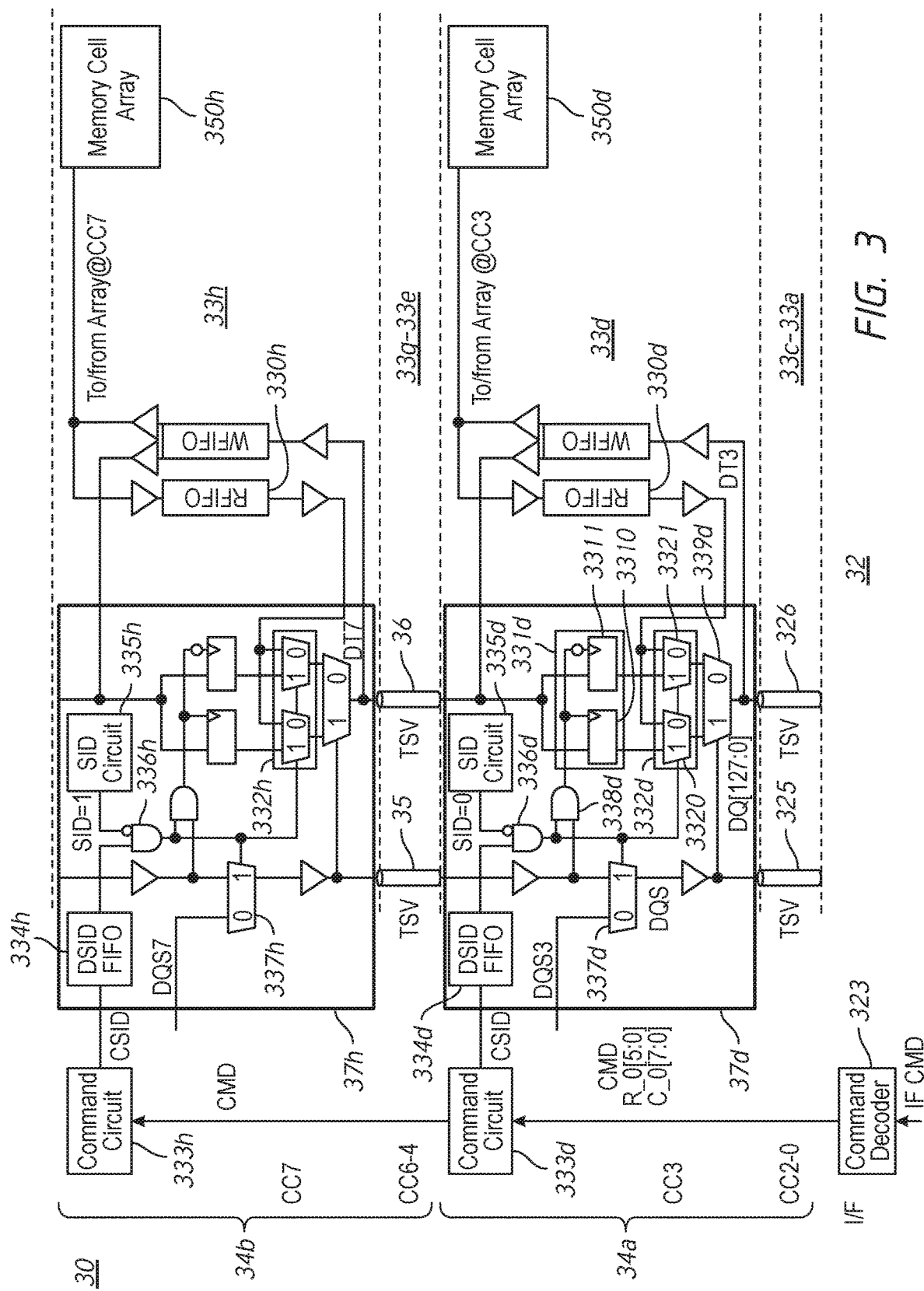
FIG. 3 is a block diagram of an HBM stack in a semiconductor device in accordance with an embodiment of the present disclosure.

FIG. 3 is a block diagram of an HBM stack 30 in a semiconductor device in accordance with an embodiment of the present disclosure. For example, the HBM stack 30 may include an interface (I/F) die 32 and a plurality of core dies (DRAM dies) CC0 to CC7. For example, the HBM stack 30 may include a command path, a data strobe path and a data path. In FIG. 3, a stack group 34a includes four core dies (e.g., core chips) CC0 to CC3 including CC3 33d which have an SID "0." A stack group 34b includes four core dies CC4 to CC7 including CC7 33h which have an SID "1." The I/F die 32 may include a command decoder 323 that may receive an intermediate IF command signal IF CMD from a controller (not shown) provided outside of the HBM stack 30, and may provide a plurality of command signals CMD. For example, the plurality of command signals CMD may include a plurality of row command/address signals R_0[5:0] and a plurality of column command/address signals C_0[7:0] to transmit commands. In a read operation, the I/F die 32 may also receive a data strobe signal DQS and data signals DQ[127:0] from the plurality of core dies CC0 to CC7 through a data strobe via 325 and a plurality of data vias 326, respectively. For example, the data strobe via 325 and the plurality of data vias 326 may be through silicon vias (TSV).

For example, the core die CC3 33d may include a command circuit 333d and a bypass circuit (e.g., a signal transmission circuit) 37d. The command circuit 333d may capture the plurality of command signals CMD including a command stack ID (CSID) indicative of a stack group, such as the stack group 34a or the stack group 34b (e.g., the SID being "0" or "1"), associated with a command (e.g., activate, read, write, precharge, etc.) in the plurality of command signals CMD. The bypass circuit 37d may include a DSID FIFO circuit 334d, which may capture the CSID responsive to each command and may further provide the captured CSID to a match circuit 336d. The bypass circuit 37d may also include a stack identifier (SID) circuit 335d. The SID circuit 335d may store a stack ID (SID) "0" of the core die CC3 33d and provide an inverted signal of the stack ID to the match circuit 336d. For example, the match circuit 336d may be an AND circuit. The match circuit 336d may receive the captured CSID from the DSID FIFO circuit 334d and the inverted stack ID of the core die CC3 33d to compare the captured SID in the command instructing "read" with the SID "0" indicative of the stack group 34a and may provide a match signal that is active low (e.g. "0" or a logic low level for indicating the match). For example, if the CSID in the command is indicative of the stack group 34b and the two SIDs do not match, the match circuit 336d may provide an inactive match signal (e.g., "1" or a logic high level) to a data strobe multiplexer 337d (e.g., a timing signal selector). The data strobe multiplexer 337d may provide a data strobe signal DQS7 from the core die CC7 33h as a data strobe signal DQS through a core data strobe via (TSV) 35 responsive to the inactive match signal from the match circuit 336d. If the CSID in the command is indicative of the stack group 34a and the two SIDs do match, the match circuit 336d may provide an active match signal (e.g., "0" or a logic low level) to the data strobe multiplexer 337d, and the data strobe multiplexer 337d may provide a data strobe signal DQS3 from the core die CC3 33d as the data strobe signal DQS responsive to the active match signal from the match circuit 336d. Thus, either the data strobe signal DQS7 or the data strobe signal DQS3 may be provided as the data strobe signal DQS to the data strobe via 325 responsive to the CSID in the command.

The bypass circuit 37d may include a data strobe enable circuit 338d. For example, the data strobe enable circuit 338d may provide the data strobe signal DQS7 from the core data strobe via 35 when the match signal from the match circuit 336d is inactive (e.g., "1" or a logic high level). Thus, the data strobe signal DQS7 may be provided to a double data rate (DDR) moderator circuit 331d. For example, the DDR moderator circuit 331d may include flip-flops 3310 and 3311. The data strobe signal DQS7 from the data strobe enable circuit 338d may enable either the flip-flop 3310 or the flip-flop 3311. For example, the flip-flop 3310 may latch data signals DT7 from a plurality of core data vias 36 responsive to a positive half period of the data strobe signal DQS7 (e.g., a first half period when the data strobe signal DQS7 is at a logic high level) and the flip-flop 3311 may latch the data signals DT7 from the plurality of core data vias 36 responsive to a negative half period of the data strobe signal DQS7 (e.g., a second half period when the data strobe signal DQS7 is at a logic low level). In this manner, a double data rate (DDR) transmission of the data signals DT7 may be executed at the timing of the data strobe signal DQS7, when the CSID is indicative of the stack group 34b. For example, the core data strobe via 35 and the plurality of core data vias 36 may be through silicon vias (TSV).

The bypass circuit 37d may include a data multiplexer circuit 332d (e.g., a data signal selector). For example, the data multiplexer circuit 332d may include a plurality of multiplexers 3320 and 3321 provided for data transmissions responsive to the positive half period and the negative half period of the data strobe signal DQS provided from the data strobe multiplexer 337d respectively. For example, if the CSID in the command is indicative of the stack group 34b and the two SIDs do not match, the plurality of multiplexers 3320 and 3321 in the data multiplexer circuit 332d may provide the data signals DT7 from the core die CC7 33h through the DDR moderator circuit 331d responsive to the inactive match signal from the match circuit 336d. If the CSID in the command is indicative of the stack group 34a and the two SIDs do match, the plurality of multiplexers 3320 and 3321 in the data multiplexer circuit 332d may provide data signals DT3 from the core die CC3 33d through a read FIFO circuit 330d responsive to the active match signal from the match circuit 336d. For example, the read FIFO circuit 330d may be coupled to a memory cell array 350d to temporarily store data read out therefrom. The data signals from the plurality of multiplexers 3320 and 3321 may be provided to a data moderator 339d. The data moderator 339d may provide the data signals from the plurality of multiplexers 3320 and 3321 responsive to the positive half period and the negative half period of the data strobe signal DQS provided from the data strobe multiplexer 337d respectively as data signals DQ[127:0]. Thus, either the data signals DT7 or the data signals DT3 may be provided as the data signals DQ[127:0] to the plurality of data vias 326 in a double data rate responsive to the CSID in the command.

For example, the core die CC7 33h may include a command circuit 333h and a bypass circuit 337h. The command circuit 333h may function similarly to the command circuit 333d. However, the bypass circuit 37h may function differently. For example, an SID circuit 335h may provide SID "1" and a match circuit 336h may provide an active match signal (e.g., "0" or a logic low level) constantly irrespective of the output of the DSID FIFO circuit 334h. Responsive to the active match signal, the data strobe multiplexer 337h may provide the data strobe signal DQS7 and the data multiplexer circuit 332h may provide the data signals DT7 from the core die CC7 33h through a read FIFO circuit 330h responsive to the constantly active match signal. For example, the read FIFO circuit 330h may be coupled to a memory cell array 350h to temporarily store data read out therefrom.

Figure 4:
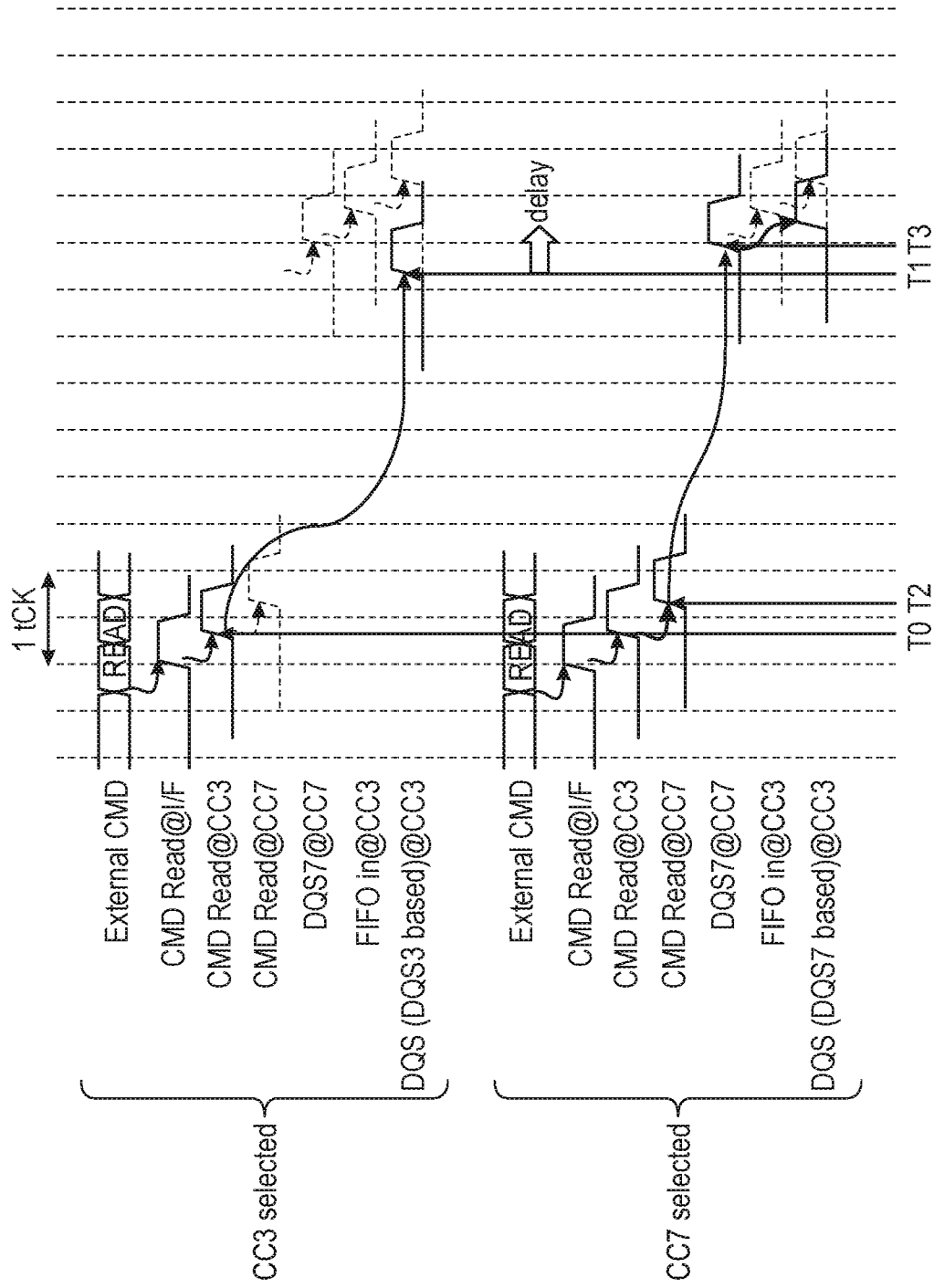
FIG. 4 is a timing diagram of command and data lines on the core dies of the HBM stack in accordance with an embodiment of the present disclosure.

FIG. 4 is a timing diagram of command and data lines on the core dies of the HBM stack 30 in accordance with an embodiment of the present disclosure. For example, a command (External CMD) "Read" transmitted in a clock cycle (=1 tCK) may be received at an interface die (CMD Read@I/F) and forwarded to the core die CC3 33d. The core die CC3 33d may receive the command at time T0. If the core die CC3 33d is selected, a data strobe signal DQS3 for the core die CC3 33d may be activated at time T1, responsive to the command at time T0. Here, the data strobe signal DQS to be provided to the interface die may be based on the data strobe signal DQS3 from the core die CC3 33d. On the other hand, if the core die CC7 33h is selected, the core die CC3 33d may forward the command to the core die CC7 33h. The core die CC7 33h may receive the command at time T2. If the core die CC7 33h is selected, a data strobe signal DQS7 for the core die CC7 33h may be activated at time T3, which is later than time T1, responsive to the command at time T2. Here, the data strobe signal DQS to be provided to the interface die may be based on the data strobe signal DQS7 from the core die CC7 33h. Thus, the data signals may be read using the data strobe signal, either DQS3 or DQS7, that is produced by the same core die that stores and provides the data signals. Here, the data strobe signal DQS based on the data strobe signal DQS7 (DQS (DQS7 based) @CC3) and a first cycle of data signals from the core die CC7 33h (FIFO in@CC3) have a time difference less than half the clock cycle (tCK), whereas the data strobe signal DQS based on the data strobe signal DQS3 ((DQS (DQS3 based) @CC3) and the first cycle of the data signals from the core die CC7 33h (FIFO in@CC3) have a time difference longer than half the clock cycle, as shown in FIG. 4. Thus, using the data strobe signal DQS based on the data strobe signal DQS7 (DQS (DQS7 based) @CC3) for reading data from the core die CC7 33h (FIFO in@CC3) may provide more accurate read timing than using the data strobe signal DQS based on the data strobe signal DQS3 ((DQS (DQS3 based) @CC3), as shown in FIG. 4.

Figure 5:
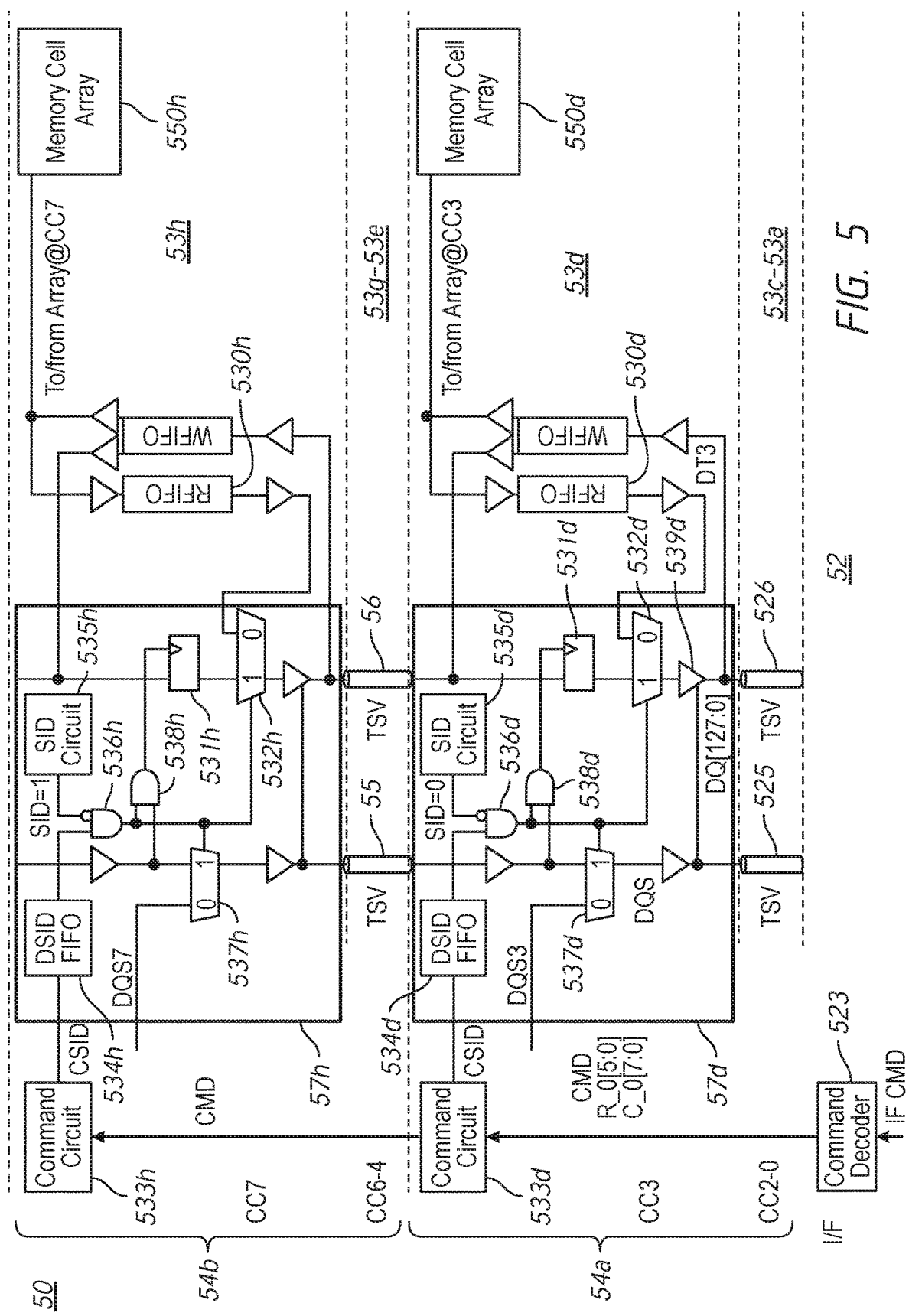
FIG. 5 is a block diagram of an HBM stack in a semiconductor device in accordance with an embodiment of the present disclosure.

FIG. 5 is a block diagram of an HBM stack 50 in a semiconductor device in accordance with an embodiment of the present disclosure. For example, the HBM stack 50 may include an interface (I/F) die 52 and a plurality of core dies CC0 to CC7. For example, the HBM stack 50 may include a command path, a data strobe path and a data path. In FIG. 5, a stack group 54a includes four core dies (e.g., core chips) CC0 to CC3 including CC3 53d which have an SID "0." A stack group 54b includes four core dies CC4 to CC7 including CC7 53h which have an SID "1." The I/F die 52 may include a command decoder 523 that may receive an intermediate IF command signal IF CMD, and may provide a plurality of command signals CMD. For example, the plurality of command signals CMD may include a plurality of row command/address signals R_0[5:0] and a plurality of column command/address signals C_0[7:0] to transmit commands. In a read operation, the I/F die 52 may also receive a data strobe signal DQS and data signals DQ[127:0] from the plurality of core dies CC0 to CC7 through a data strobe via 525 and a plurality of data vias 526, respectively. For example, the data strobe via 325 and the plurality of data vias 326 may be through silicon vias (TSV).

For example, the core die CC3 53d may include a command circuit 533d and a bypass circuit 57d. The command circuit 533d may capture the plurality of command signals CMD including a command stack ID (CSID) indicative a stack group, such as the stack group 54a or the stack group 54b (e.g., the SID being "0" or "1"), associated with a command (e.g., activate, read, write, precharge, etc.) in the plurality of command signals CMD. The bypass circuit 57d may include a DSID FIFO circuit 534d, which may capture the CSID responsive to the command and may further provide the captured CSID to a match circuit 536d. The bypass circuit 57d may also include a stack ID (SID) circuit 535d. The SID circuit 535d may store a stack ID (SID) "0" of the core die CC3 53d and provide an inverted signal of the stack ID to the match circuit 536d. For example, the match circuit 536d may be an AND circuit. The match circuit 536d may receive the captured CSID from the DSID FIFO circuit 534d and the inverted stack ID of the core die CC3 53d to compare the captured SID in the command instructing "read" with the SID "0" indicative of the stack group 54a and may provide a match signal that is active low (e.g. "0" or a logic low level for indicating the match). For example, if the CSID in the command is indicative of the stack group 54b and the two SIDs do not match, the match circuit 536d may provide an inactive match signal (e.g., "1" or a logic high level) to a data strobe multiplexer 537d, and the data strobe multiplexer 537d may provide a data strobe signal DQS7 from the core die CC7 53h as a data strobe signal DQS through a core data strobe via (TSV) 55 responsive to the inactive match signal from the match circuit 536d. If the CSID in the command is indicative of the stack group 54a and the two SIDs do match, the match circuit 536d may provide an active match signal (e.g., "0" or a logic low level) to the data strobe multiplexer 537d, and the data strobe multiplexer 537d may provide a data strobe signal DQS3 from the core die CC3 53d as the data strobe signal DQS responsive to the active match signal from the match circuit 536d. Thus, either the data strobe signal DQS7 or the data strobe signal DQS3 may be provided as the data strobe signal DQS to the data strobe via 525 responsive to the CSID in the command.

The bypass circuit 57d may include a data strobe enable circuit 538d. For example, the data strobe enable circuit 538d may provide the data strobe signal DQS7 from the core data strobe via 55 when the match signal from the match circuit 536d is inactive (e.g., "1" or a logic high level). Thus, the data strobe signal DQS7 may be provided to a single data rate (SDR) moderator circuit 531d. For example, the SDR moderator circuit 531d may be a flip-flop. The data strobe signal DQS7 from the data strobe enable circuit 538*d* may enable the SDR moderator circuit 531*d*. For example, the SDR moderator circuit 531*d* may latch data signals DT7 from a plurality of core data vias 56 responsive to a positive half period of the data strobe signal DQS7 (e.g., a first half period when the data strobe signal DQS7 is at a logic high level). In this manner, a single data rate (SDR) transmission of the data signals DT7 may be executed at the timing of the data strobe signal DQS7, when the CSID is indicative of the stack group 54*b*. For example, the core data strobe via 55 and the plurality of core data vias 56 may be through silicon vias (TSV).

The bypass circuit 57*d* may include a data multiplexer circuit 532*d*. For example, the data multiplexer circuit 532*d* may be a multiplexer provided for data transmission responsive to the positive half period of the data strobe signal DQS provided from the SDR moderator circuit 531*d*. For example, if the CSID in the command is indicative of the stack group 54*b* and the two SIDs do not match, the data multiplexer circuit 532*d* may provide the data signals DT7 from the core die CC7 53*h* through the SDR moderator circuit 531*d* to a data moderator 539*d*, responsive to the inactive match signal from the match circuit 536*d*. If the CSID in the command is indicative of the stack group 54*a* and the two SIDs do match, the data multiplexer circuit 532*d* may provide data signals DT3 from the core die CC3 53*d* through a read FIFO circuit 530*d* to a data moderator 539*d*, responsive to the active match signal from the match circuit 536*d*. For example, the read FIFO circuit 530*d* may be coupled to a memory cell array 550*d* to temporarily store data read out therefrom. The data moderator 539*d* may provide the data signals from the data multiplexer circuit 532*d* responsive to the positive half period of the data strobe signal DQS provided from the data strobe multiplexer 537*d* respectively as data signals DQ[127:0]. Thus, either the data signals DT7 or the data signals DT3 may be provided as the data signals DQ[127:0] to the plurality of data vias 526 in a single data rate responsive to the CSID in the command.

For example, the core die CC7 53*h* may include a command circuit 533*h* and a bypass circuit 57*h*. The command circuit 533*h* may function similarly to the command circuit 533*d*. However, the bypass circuit 57*h* may function differently. For example, an SID circuit 535*h* may provide SID "1" and a match circuit 536*h* may provide an active match signal (e.g., "0" or a logic low level) constantly. Responsive to the active match signal, the data strobe multiplexer 537*h* may provide the data strobe signal DQS7 and the data multiplexer circuit 532*h* may provide the data signals DT7 from the core die CC7 53*h* through a read FIFO circuit 530*h* responsive to the constantly active match signal. For example, the read FIFO circuit 530*h* may be coupled to a memory cell array 550*h* to temporarily store data read out therefrom.

Logic levels of signals and logic gate combinations used in the embodiments described the above are merely examples. However, in other embodiments, combinations of logic levels of signals and combinations of logic gates other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a first semiconductor chip;
   a second semiconductor chip; and
   a first via and a plurality of second vias coupling the first semiconductor chip and the second semiconductor chip;
   wherein the first semiconductor chip is configured to provide a first timing signal to the first via and further configured to provide first data to the plurality of second vias responsive to the first timing signal, and
   wherein the second semiconductor chip is configured to provide the first data responsive to the first timing signal when the first semiconductor chip is designated, and
   wherein the second semiconductor chip is further configured to provide a second timing signal and further configured to provide second data responsive to the second timing signal when the second semiconductor chip is designated.

2. The apparatus of claim 1, further comprising:
   a first stack group including the first semiconductor chip; and
   a second stack group including the second semiconductor chip,
   wherein the second semiconductor chip comprises:
      a command circuit configured to receive a command signal and further configured to provide a command stack identifier associated with the command signal; and
      a signal transmission circuit configured to receive the first timing signal from the first via and the first data from the plurality of second vias and further configured to provide the first data responsive to the first timing signal, when the command stack identifier is indicative of the first stack group and to provide the second data responsive to the second timing signal, when the command stack identifier is indicative of the second stack group.

3. The apparatus of claim 1, wherein the second semiconductor chip comprises a timing signal selector configured to receive the first timing signal from the first via and to receive the second timing signal, and further configured to provide either the first timing signal or the second timing signal responsive to a control signal.

4. The apparatus of claim 3, wherein the second semiconductor chip further comprises:
   a stack identifier circuit configured to provide a chip stack identifier indicative of the second stack group; and
   a match circuit configured to receive a command stack identifier and the chip stack identifier and further configured to provide the control signal responsive to whether the command stack identifier is indicative of the chip stack identifier.

5. The apparatus of claim 4, further comprising a command circuit configured to receive a command signal and further configured to provide the command stack identifier associated with the command signal to the stack identifier circuit.

6. The apparatus of claim 5, wherein the command circuit is included in the second semiconductor chip.

7. The apparatus of claim 4, wherein the second semiconductor chip further comprises a signal data moderator circuit configured to provide the first data responsive to the first timing signal and the command stack identifier indicative of the first stack group.

8. The apparatus of claim 7, wherein the first semiconductor chip is configured to provide the first data at a double data rate, and
wherein the signal data moderator circuit is configured to latch the first data responsive to a first half period and a second half period of the first timing signal.

9. An apparatus comprising:
first and second semiconductor chips that are stacked with each other;
a plurality of vias provided in at least one of the first and second semiconductor chips and configured to couple the first and second semiconductor chips;
wherein the first semiconductor chip is configured to provide a first data strobe signal and to temporarily store first data, and the first semiconductor chip is further configured to provide first data responsive to the first data strobe signal when the first semiconductor chip is selected, and
wherein the second semiconductor chip is configured to provide a second data strobe signal and to temporarily store second data, and the second semiconductor chip is further configured to transmit the first data from the first semiconductor chip responsive to the first data strobe signal when the first semiconductor chip is selected, and to provide the second data responsive to the second data strobe signal when the second semiconductor chip is selected.

10. The apparatus of claim 9, wherein the second semiconductor chip comprises:
a memory cell array; and
a signal transmission circuit configured to receive the first data strobe signal and the first data from the first semiconductor chip and further configured to provide the first data responsive to the first data strobe signal when a command stack identifier is indicative of the first semiconductor chip, and to provide the second data from the memory cell array responsive to the second data strobe signal when the command stack identifier is indicative of the second semiconductor chip.

11. The apparatus of claim 10, wherein the command stack identifier indicative of the first semiconductor chip is the command stack identifier indicative of a first stack group including the first semiconductor chip and the command stack identifier indicative of the second semiconductor chip is the command identifier indicative of a second stack group including the second semiconductor chip.

12. The apparatus of claim 11, wherein the signal transmission circuit includes a match circuit configured to store a chip stack identifier indicative of the second stack group and to receive the command stack identifier, and further configured to provide a control signal responsive to whether the command stack identifier is indicative of the chip stack identifier.

13. The apparatus of claim 12, wherein the signal transmission circuit further includes a data strobe multiplexer configured to receive the first data strobe signal from the first semiconductor chip and to receive the second data strobe signal, and further configured to provide either the first data strobe signal or the second data strobe signal responsive to the control signal.

14. The apparatus of claim 12, wherein the signal transmission circuit further includes a data multiplexer circuit configured to receive the first data from the first semiconductor chip and to receive the second data from the memory cell array, and further configured to provide either the first data or the second data responsive to the control signal.

15. A semiconductor device comprising:
a memory array;
a first-in-first-out (FIFO) circuit configured to temporarily store first data from the memory array;
a plurality of data vias configured to receive second data;
a data strobe via; and
a signal transmission circuit including a data strobe multiplexer configured to receive a first data strobe signal, and further configured to receive a second data strobe signal from the data strobe via,
wherein the data strobe multiplexer is further configured to provide the first data strobe signal in a first mode and to provide the second strobe signal in a second mode.

16. The apparatus of claim 15, wherein the signal transmission circuit further includes a data multiplexer circuit configured to provide the first data from the FIFO circuit in the first mode responsive to the first data strobe signal and further configured to provide the second data from the plurality of data vias in the second mode responsive to the second data strobe signal.

17. The apparatus of claim 15, wherein the signal transmission circuit further includes a stack identifier circuit configured to store a chip stack identifier designating the second memory array.

18. The apparatus of claim 17, wherein the signal transmission circuit further includes a match circuit configured to receive a command stack identifier and the chip stack identifier and further configured to provide a control signal responsive to whether the command stack identifier is indicative of the chip stack identifier.

19. The apparatus of claim 18, wherein the signal transmission circuit further includes a command stack identifier FIFO circuit configured to receive the command stack identifier and further configured to provide the command stack identifier to the match circuit.

20. The apparatus of claim 19, wherein the signal transmission circuit further includes a command circuit configured to receive a command signal and further configured to provide the command stack identifier associated with the command signal.

* * * * *